(12) United States Patent
Ripley et al.

(10) Patent No.: US 7,922,863 B2
(45) Date of Patent: Apr. 12, 2011

(54) APPARATUS FOR INTEGRATED GAS AND RADIATION DELIVERY

(75) Inventors: Martin John Ripley, Durham (GB); Sean M. Seutter, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1118 days.

(21) Appl. No.: 11/615,633

(22) Filed: Dec. 22, 2006

(65) Prior Publication Data

US 2008/0152840 A1   Jun. 26, 2008

(51) Int. Cl.
*H01L 21/306* (2006.01)
*C23F 1/00* (2006.01)
*C23C 16/00* (2006.01)

(52) U.S. Cl. ............................ 156/345.34; 118/723 MP
(58) Field of Classification Search ............. 156/345.34; 118/723 MP
See application file for complete search history.

(56) References Cited

U.S. PATENT DOCUMENTS

| | | | |
|---|---|---|---|
| 4,181,751 A | 1/1980 | Hall et al. | |
| 4,654,226 A | 3/1987 | Jackson et al. | |
| 4,919,077 A | 4/1990 | Oda et al. | |
| 4,987,855 A | 1/1991 | Ahlgren | |
| 5,112,647 A | 5/1992 | Takabayashi | |
| 5,183,511 A | 2/1993 | Yamazaki et al. | |
| 6,015,503 A * | 1/2000 | Butterbaugh et al. | 216/66 |
| 6,143,081 A * | 11/2000 | Shinriki et al. | 118/719 |
| 6,565,661 B1 * | 5/2003 | Nguyen | 118/715 |
| 6,566,278 B1 | 5/2003 | Harvey et al. | |
| 6,627,268 B1 | 9/2003 | Fair et al. | |
| 6,829,411 B2 * | 12/2004 | Easley | 385/31 |
| 6,970,247 B2 * | 11/2005 | Yankielun | 356/436 |
| 2003/0019580 A1 * | 1/2003 | Strang | 156/345.33 |
| 2005/0118737 A1 * | 6/2005 | Takagi et al. | 438/14 |
| 2006/0102076 A1 | 5/2006 | Smith et al. | |
| 2006/0286774 A1 | 12/2006 | Singh et al. | |

* cited by examiner

*Primary Examiner* — Parviz Hassanzadeh
*Assistant Examiner* — Keath T Chen
(74) *Attorney, Agent, or Firm* — Patterson & Sheridan, LLP

(57) ABSTRACT

An apparatus for photo-assisted or photo-induced processes is disclosed, comprising a process chamber having an integrated gas and radiation distribution plate. In one embodiment, the plate has one set of apertures for distributing one or more process gases, and another set of apertures for distributing radiation to a process region in the chamber.

11 Claims, 7 Drawing Sheets

US 7,922,863 B2

APPARATUS FOR INTEGRATED GAS AND RADIATION DELIVERY

BACKGROUND OF THE INVENTION

1. Field of the Invention

Embodiments of the present invention generally relate to an apparatus for delivering process gas and radiation to a process chamber.

2. Description of the Related Art

In the fabrication of integrated circuits, different material layers are formed by various deposition techniques, and circuit patterns are formed in these material layers by photolithography and etching. Deposition and etching are often performed in process chambers in which reactive species are generated by providing energy to one or more process gases or precursors. In certain processes, the energy is provided in the form of heat. It is often desirable, especially in advanced device fabrication, to minimize the processing temperature in order to obtain satisfactory processing results, improved production yield and robust device performance.

In certain situations, photo-assisted or photo-induced processes may allow film depositions to be performed at reduced temperatures or at increased rate. In existing chamber design, radiation may be coupled into the chamber through a window provided on a lid or a wall of the processing chamber. However, radiation delivered through the window may not provide sufficient uniformity or adequate coverage inside the chamber. Therefore, there is a need for alternative designs for delivering radiation to a process chamber with improved uniformity or process flexibility.

SUMMARY OF THE INVENTION

One embodiment of the invention provides an apparatus that includes a process chamber having a process region defined therein, a plate having a first aperture for distributing at least one gas into the process region and a second aperture for distributing radiation into the process region, and a support proximate the plate for supporting a substrate for processing inside the chamber.

Another embodiment of the invention provides a method of processing, which includes: (a) providing a chamber having an integrated gas and radiation distribution plate, (b) introducing one or more process gases into the chamber through a plurality of first apertures in the plate, (c) providing radiation into the chamber through a plurality of second apertures in the plate, and (d) performing inside the chamber at least one of depositing a material, etching a material, and treating a surface utilizing the introduced gas and provided radiation.

BRIEF DESCRIPTION OF THE DRAWINGS

So that the manner in which the above recited features, advantages and objects of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention relates to an apparatus for photo-assisted processes. More particularly, an integrated gas and radiation delivery or distribution plate is provided in a chamber for delivering or distributing process gases and radiation to a process region in the chamber.

The integrated gas and radiation delivery plate (also referred to as a face plate) may be used in conjunction with a variety of process chambers for photo-assisted or photo-induced processes such as deposition, etching, conditioning or cleaning. Suitable process chambers that may be adapted for use with the teachings disclosed herein include, for example, chemical vapor deposition (CVD) chambers such as SiNgen™ or SiNgen-Plus™ chambers, which are low pressure CVD chambers commercially available from Applied Materials, Inc. of Santa Clara, Calif. Various aspects of these chambers are disclosed in commonly assigned U.S. patent application, published as U.S. 2006/0102076A1, "Apparatus and Method for the Deposition of Silicon Nitride Films", by Smith et al., which is herein incorporated by reference in its entirety. It is contemplated that embodiments of the present invention can be adapted for use in many other process chambers, including those from other manufacturers.

Figure 1:
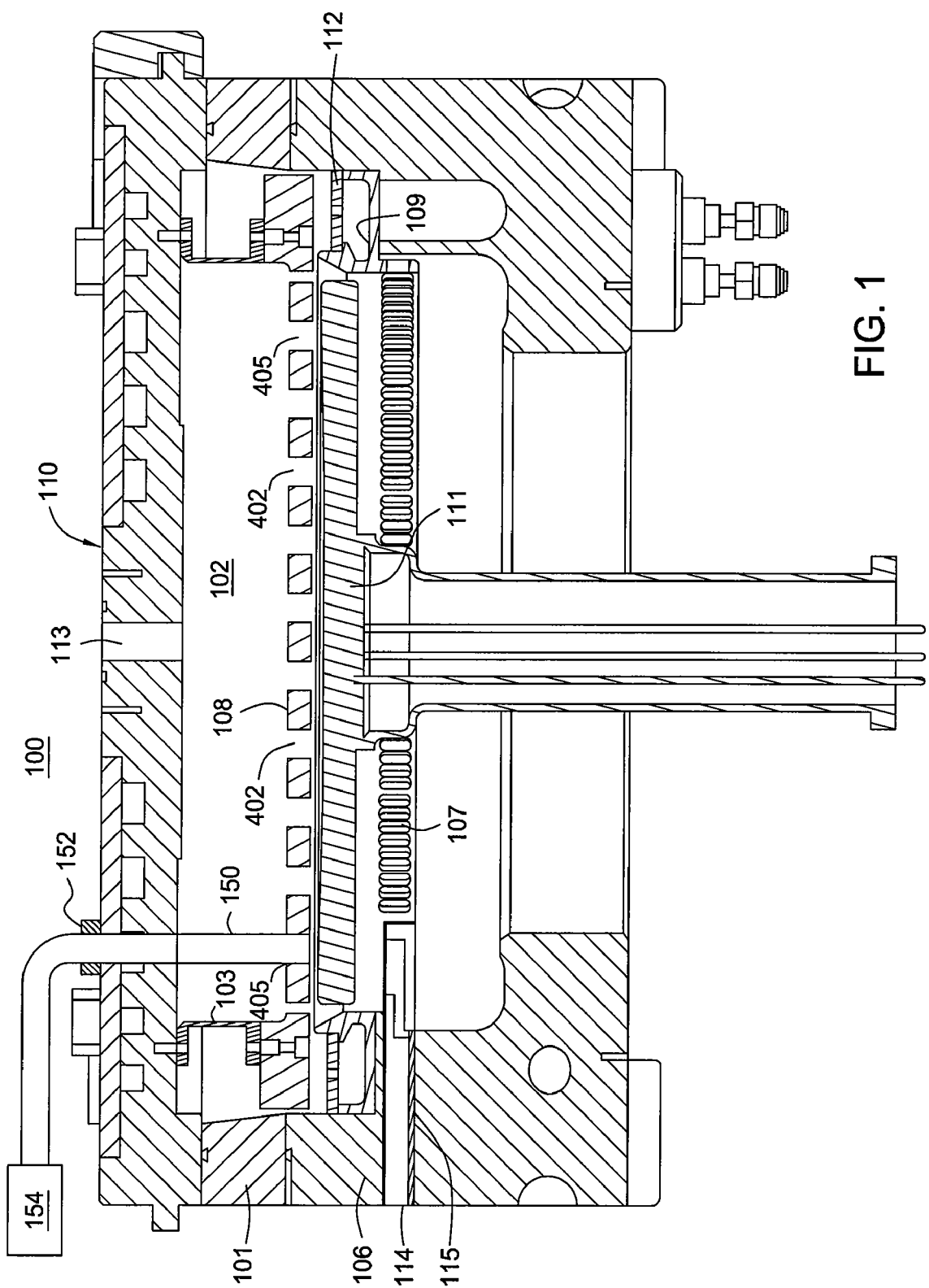
FIG. 1 is a cross-sectional view of a process chamber incorporating an integrated gas and radiation delivery plate.

FIG. 1 is a schematic cross-sectional view of a process chamber 100 that incorporates a gas and radiation delivery plate of the present invention. The particular embodiment of the chamber 100 shown herein is provided for illustrative purposes and should not be used to limit the scope of the invention.

Process chamber 100 is a single wafer CVD chamber having a substantially cylindrical wall 106 closed at its upper end by a lid 110. In general, the lid 110 is part of a lid assembly, which may include gas feed inlets, a gas mixer, a plasma source, and one or more plates for delivering and distributing gases and/or radiation to the chamber 100. A slit valve opening 114 is provided in the wall 106 to allow a substrate to enter the chamber 100. For some applications, sections of the wall 106 may be heated.

A substrate support assembly 111 supports the substrate and may also provide heat to the chamber 100. The base of the chamber 100 may contain additional apparatus, such as a reflector plate or other mechanism tailored to facilitate heat transfer, probes to measure chamber conditions, an exhaust assembly, and other equipment to control the substrate or chamber environment.

A feed gas (e.g., one or more process gases) may enter the chamber 100 from a gas delivery system through a gas mixer 113 disposed in the lid 110. The feed gas exiting the mixer 113 enters a mixing region 102 created between the lid 110 and a face plate 108. The face plate 108 has a number of apertures 402 for distributing the feed gas from the mixing region 102 into a processing region defined between the chamber wall 106, the face plate 108, and the substrate support 111. Furthermore, the face plate 108 has additional apertures 405 for distribution radiation into the processing region. One or more light transmitting conduits 150, e.g., light pipes or optical fibers, are provided inside each of these apertures 405 and connected via a vacuum feedthrough 152 to a radiation source 154 external to the chamber 100. For the sake of clarity, only one aperture 405 is shown with a conduit in FIG. 1. Alternatively, more than one radiation sources 154 may be connected to conduits 150 to provide different radiation to various parts of the process region. In one embodiment, the substrate support assembly 111 is configured to be rotatable, which allows further improvement for the distribution of radiation and gas across a substrate.

Exhaust gas exits the chamber 100 at the base through the exhaust pumping plate 107. Optionally, the chamber 100 may include a heated insert piece 101 between the chamber wall 106 and the lid 110. The insert piece 101 heats the adaptor ring 103, and consequently, the mixing region 102. Other hardware options illustrated by FIG. 1 include an exhaust plate cover 112, which rests on top of the exhaust pumping plate 109, and a slit valve liner 115, which may be used to reduce heat loss through the slit valve opening 114.

Figure 2:
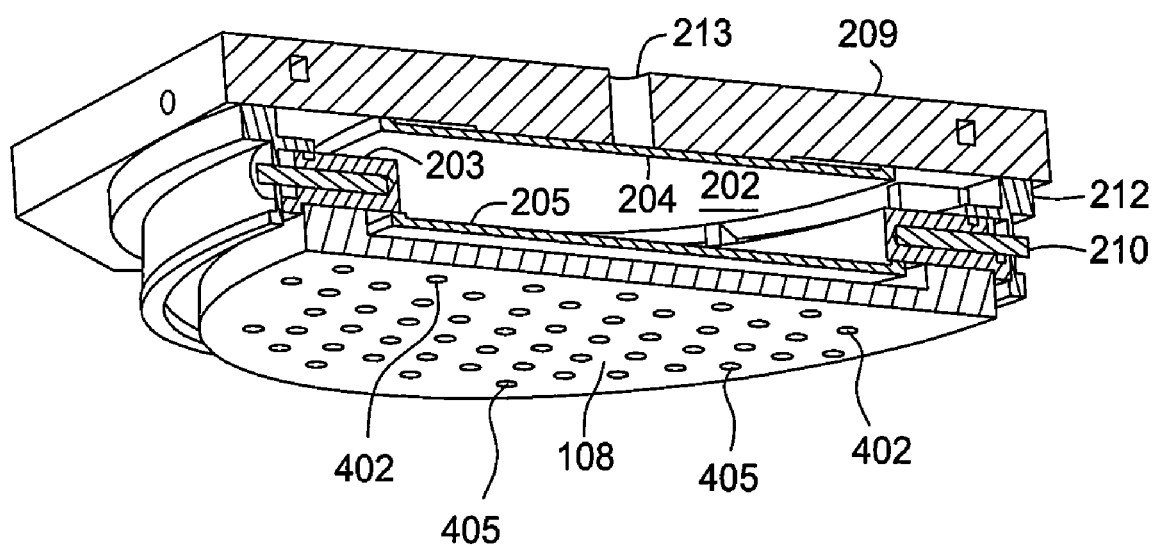
FIG. 2 is a perspective schematic view of a lid assembly.

FIG. 2 is an expanded view of an alternative embodiment of a lid assembly 200. In this embodiment, the lid assembly 200 further comprises a first blocker plate 204 and a second blocker plate 205, which are used, along with the face plate 108, to improve distribution and/or mixing of the process gases. Alternatively, the face plate 108 may be used in conjunction with only one of these blocker plates. The first blocker plate 204 may be attached to the bottom side of the lid 209 by screws, bolts, or other appropriate fastening means (not shown). As shown in FIG. 2, the lid 209 is separated from the second blocker plate 205 and the face plate 108 by thermal insulating break elements 212, which are provided on the upper and lower surface of a heater jacket 203. The heater jacket 203 is connected to the second blocker plate 205 and the face plate 108, which allows heating of the process gases in the mixing region 202. Optionally, the lid 209 or other components of the lid assembly 200 may be heated by another heater (not shown).

The lid assembly 200 includes a gas inlet 213 leading to a mixing region 202 defined by the lid 209, the thermal break elements 212, the heater jacket 203, and the blocker plates 204 and 205. The gas inlet 213 may be connected to a fluid delivery system (not shown), which, depending on the specific process, may include a liquid and/or gas source of precursor materials or gases. The fluid delivery system may also comprise various equipment such as flow meter, vaporizer, injector, among others. Optionally, the feed gas may be premixed, either before or inside the gas inlet 213. The mixing region 202 provides a long residence time thereby allowing the gases to thoroughly mix before entering the processing region of the chamber through the face plate 208. The surfaces surrounding mixing region 202 is heated by a heater 210, which helps prevent the buildup of materials on these surfaces. The heated surfaces also preheat the process gases to improve heat and mass transfer once the gases exit the face plate 208 into the processing region.

Figure 3:
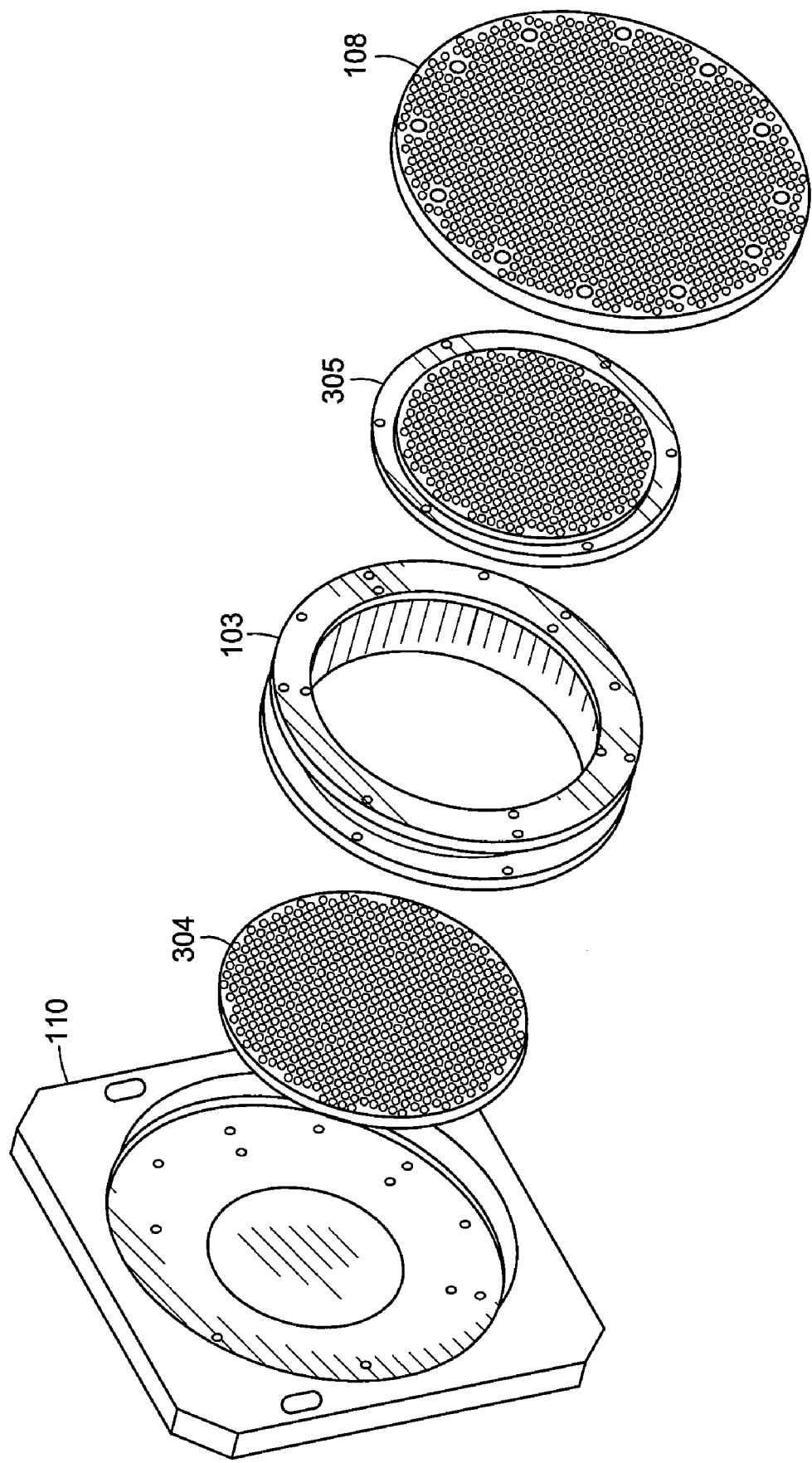
FIG. 3 is an exploded view of various components of a lid assembly.

FIG. 3 is an exploded view of one embodiment of a lid assembly 300 comprising the lid 110, adaptor ring 103, face plate 108, and optionally, a first blocker plate 304 and a second blocker plate 305. Both first and second blocker plates 304, 305 are provided with apertures for improving the distribution and/or mixing of process gases, as well as apertures for accommodating the conduits for delivering radiation to the processing region.

As shown in FIG. 1, the adapter ring 103 is attached to the bottom of the lid 110, and the face plate 108 is attached to a bottom side of the adapter ring 103 by screws or other appropriate fastening means. In embodiments using either one or both blocker plates, the first blocker plate 304 is disposed between the bottom of the lid 110 and a top side of the adapter ring 103, and the second blocker plate 305 is disposed between the bottom side of the adapter ring 103 and the face plate 108. When both plates are used, the first and second blocker plates 304 and 305 are separated by the mixing region 102.

Figure 4A:
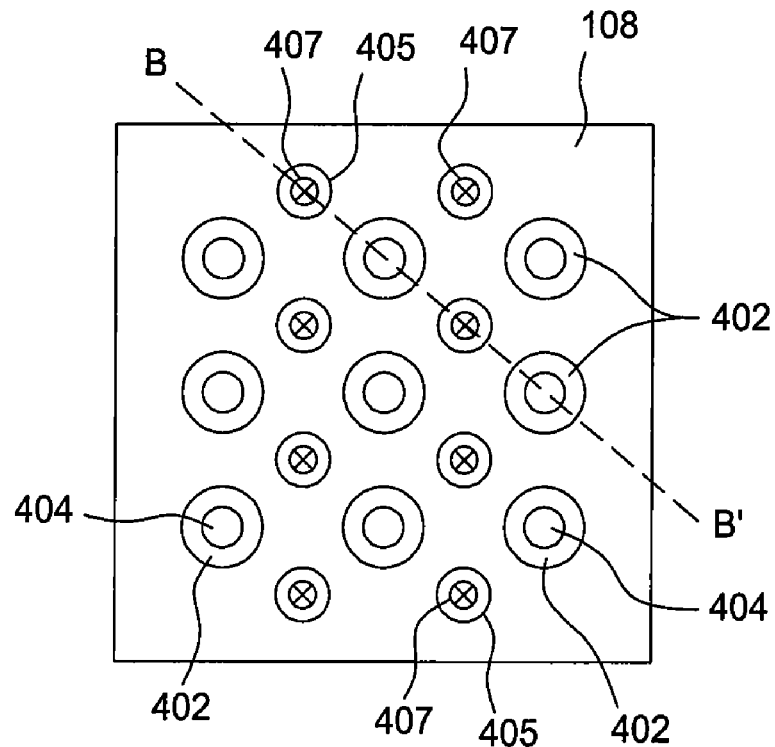
FIG. 4A is an expanded bottom view of a portion of an integrated gas and radiation delivery plate.
Figure 4B:
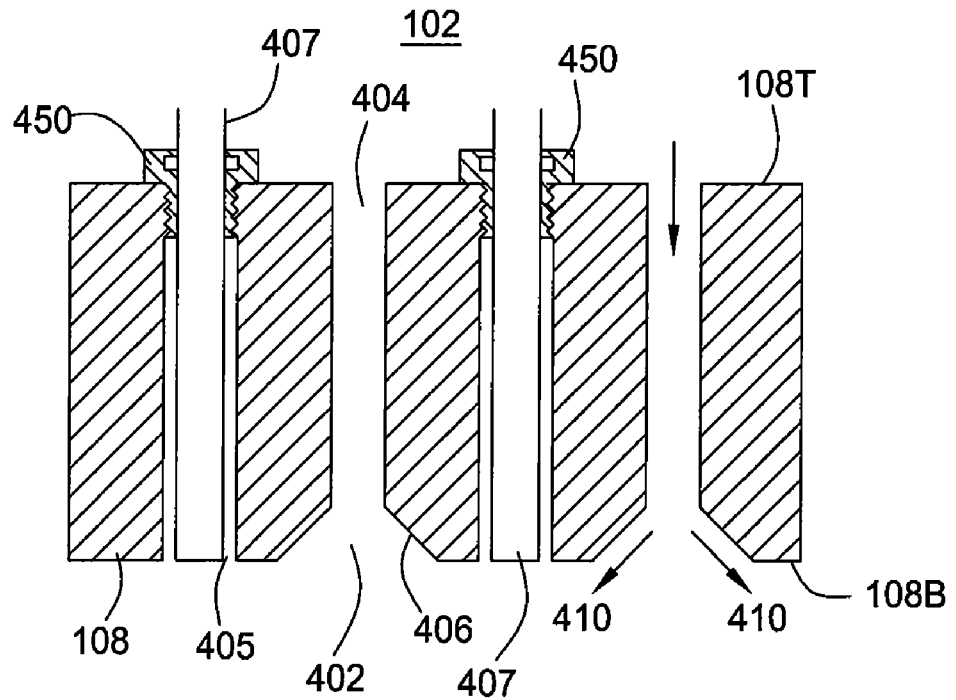
FIG. 4B is a sectional view of the integrated gas and radiation delivery plate of FIG. 4A.
Figure 4C:
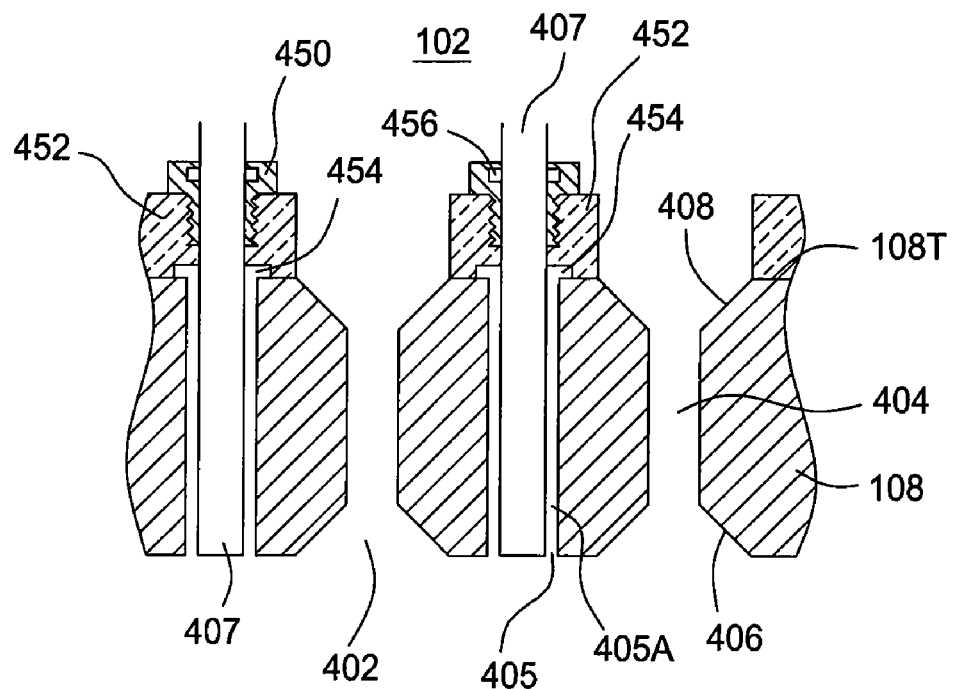
FIG. 4C is a sectional view of another embodiment of the integrated gas and radiation delivery plate.
Figure 4D:
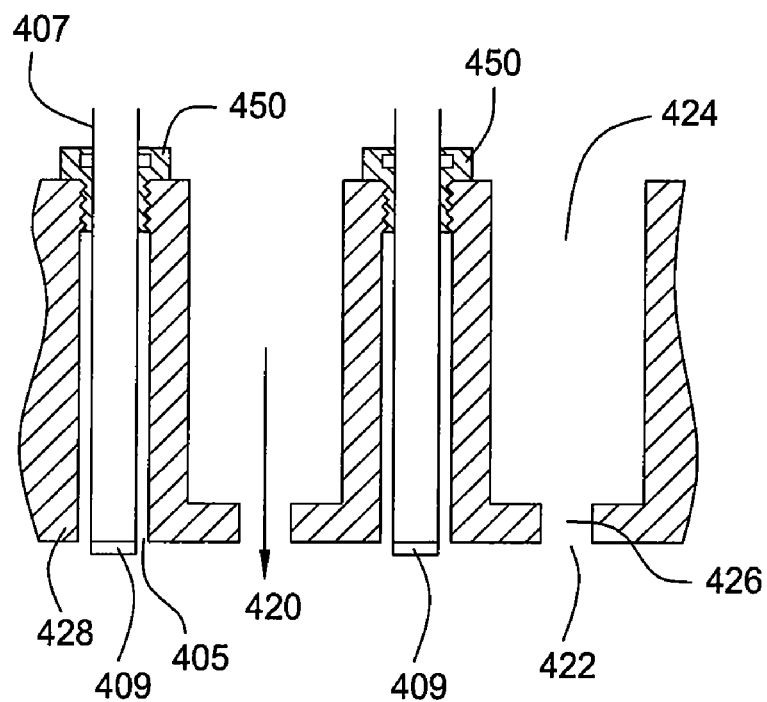
FIG. 4D is a sectional view of yet another embodiment of the integrated gas and radiation delivery plate.

FIGS. 4A-B are partial bottom and sectional views of one embodiment of the face plate 108 of the present invention. A number of holes or apertures are provided in various patterns to create a desired distribution of gas and radiation inlets to the processing region of the chamber. FIG. 4A illustrates schematically an expanded, bottom view of a portion of the face plate 108, and FIG. 4B shows a cross-sectional view along the line B-B' of FIG. 4A. The face plate 108 comprises a first group of apertures 402 (or gas inlets) for distributing at least one process gas or gas mixture, and a second group of apertures 405 for distributing radiation into the chamber 100. In the embodiment of FIGS. 4A-B, each gas inlet 402 has a channel region 404 connected to an outwardly tapered region 406 near the bottom 108B of the face plate 108. Thus, a feed gas enters the channel region 404 from the mixing region 102 adjacent the top 108T of the face plate 108 and flows through the tapered region 406. As the feed gas exits the bottom 108B of the face plate 108, it expands into the processing region of the chamber 100 (e.g., along directions of the arrows 410). Alternatively, the face plate 108 may also have another tapered region 408 at the top surface 108T, as shown in FIG. 4C. FIG. 4D illustrates another embodiment of a face plate 428, in which a gas inlet 422 is provided with a channel region 424 connected to a narrower region 426 towards the bottom of the face plate 428. In this configuration, the feed gas exits the face plate 408 in a more focused direction, as shown by arrow 420. In one embodiment, the ratio of the lateral dimensions between the narrower region 426 and the channel region 424 is about 1:4. It is contemplated that many other shapes or designs for the gas inlets may also be used.

In the embodiments, one or more conduits or light pipes 407, e.g., optical fibers, are provided inside each aperture 405 for coupling radiation from one or more radiation sources (e.g., 154 in FIG. 1) into the chamber 100. Each conduit 407 can be mounted or secured inside the aperture 405 using techniques known to one skilled in the art. For example, a mount or ferrule 450 may be used to secure the conduit 407 inside the aperture 405, as well as to isolate the aperture 405 from the mixing region 102 using appropriate sealing means, including O-rings, gaskets, among others. Different types of fasteners, mounts or holders may be used, with materials that are compatible with the process conditions. In one embodiment, the conduit mounts may be made of TEFLON® or other suitable materials, including plastic or others materials that are chemically resistant and/or suitable for high temperature operations. For applications in which the temperature of the processing region is relatively high, the mounts or ferrules 450 may be provided closer to the top 108T of the face plate 108. The aperture 405 near the top 108T of the face plate 108 may have a threaded portion for coupling to the ferrule 450. The conduits or light pipes 407 may be flexible or rigid, although flexible conduits may facilitate installation inside the lid assembly as well as allow the radiation source to be placed at locations away from the chamber lid 110, instead of being placed in the line-of-sight with respect to the processing region. In general, the radiation may be in the ultra-violet (UV), visible or infra-red (IR) region, and suitable sources such as various discharges, lamps or lasers may be used.

As shown in the embodiment of FIG. 4D, the end of the light conduit 407 inside the chamber 100 may further be provided with a diffuser 409, which would result in a larger illumination area compared to a conduit without the diffuser. A variety of diffuser designs may be used, including a rounded or angled, ground tip, or others known to one skilled in the art. Alternatively, the tip of the conduit may also be fitted with a microlens for controlling the illumination areas inside the processing region.

The face plate 108 typically has a relatively large number of gas inlets or apertures 402 to provide uniform distribution of process gases to the processing region. In one embodiment, the number of apertures 405 for radiation distribution is about equal to that of the gas-distributing apertures 402. In general, the face plate 108 can have different combinations of numbers, density and dimensions for the two types of apertures 402, 405. The radiation distribution apertures 405 may have lateral dimensions similar to those used for gas distribution, for example, with diameters up to about 10 mm. It is contemplated that the lateral dimensions for the radiation distribution apertures 405 may range from about 1 mm to about 10 mm in one embodiment, and may range from about 1 mm to about 5 mm in another embodiment. It is expected that smaller radiation distribution apertures 405 may be advantageous for minimizing potential impact on gas distribution, although they should be sufficiently large to accommodate a light pipe or optical fibers. In another embodiment, the gas distribution apertures 402 may have dimensions ranging from about 0.4 mm to about 5 mm. It is understood, however, that other dimensions for these apertures may also be used, as consistent with hardware design and/or process requirements.

Figure 5:
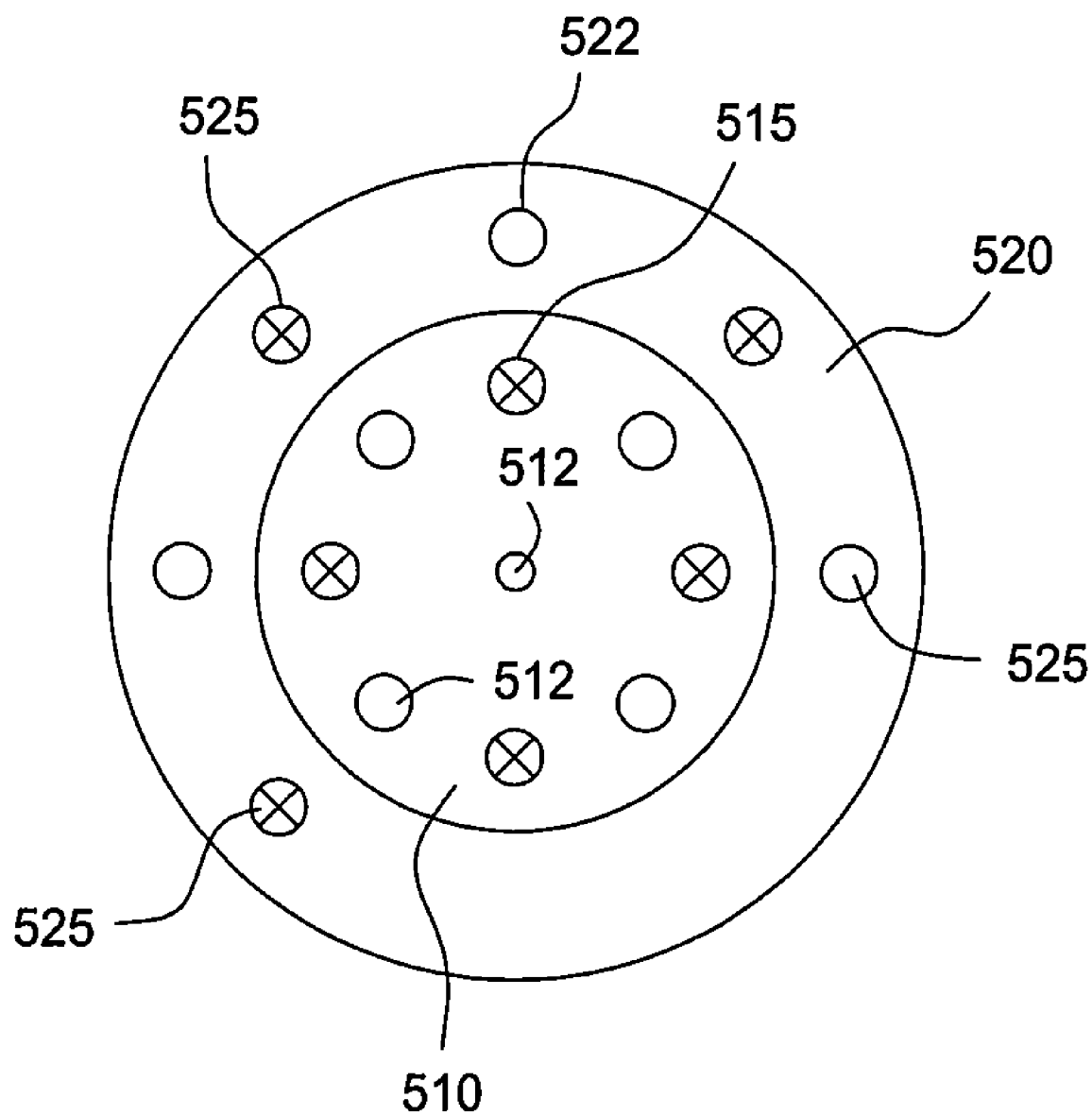
FIG. 5 is a bottom view of another embodiment of the integrated gas and radiation delivery plate divided into different zones.

To provide process flexibility, the configuration of apertures for gas and radiation distribution, e.g., combinations of the number, density (number per unit area), dimension or shapes of apertures, may vary across the face plate 108. For example, if a certain process requires a higher distribution of precursor or reactant species near the center of the substrate compared to the other region of the substrate, the gas-distribution and/or radiation-distribution apertures 402, 405 in the center of the face plate 108 may be configured differently from the outer region of the plate 108, in order to provide the desired distribution of precursor gases or reactant species. As shown in the example of FIG. 5, a face plate 500 may be divided into a center or inner zone 510 and an outer zone 520, each having its own configuration, i.e., any combination of numbers, densities, dimensions or shapes of each type of apertures. Thus, the outer zone 520 may have gas inlets 522 and radiation-distribution apertures 525 that are different from those of the gas inlets 512 and radiation-distribution apertures 515 in the inner zone 510. The distribution pattern of these apertures may be either symmetrical or asymmetrical. It is contemplated that other zone configurations of the face plate may also be used, e.g., the zones may be provided as quadrants or wedges, or other shapes that may be appropriate for particular process applications.

It is further understood that, if either of the blocker plates 304, 305 is used in conjunction with the face plate, each blocker plate may also be provided with appropriate apertures to accommodate the light pipes or conduits.

In an alternative embodiment, at least some of the light conduits can be connected to radiation sources with different spectral characteristics, e.g., wavelengths and/or intensities. Additional process flexibilities can be achieved, for example, by providing different radiation fluxes in the processing region, which may allow customization or tuning of process characteristics to achieve desired results, e.g., deposition rate or uniformity across the substrate. Furthermore, by providing radiation only to certain regions or zones of the face plate 108, processes may also be performed with spatial selectivity, e.g., to allow selective processing at one or more predetermined regions of the substrate.

To avoid undesirable deposit on the tips of the light pipes or optical fibers, an inert gas flow may optionally be provided around each light pipe, for example, by using the a portion 405A of the aperture 405 surrounding each conduit 407 to serve as a gas channel. This is illustrated in FIG. 4C, in which a plate 452 (may also be referred to as a purge gas distribution plate) having one or more gas channels 454 is coupled to the top surface 108T of the face plate 108. Bolts, screws or other suitable fastening means (not shown) may be used to couple the plate 452 to the face plate 108. In this embodiment, ferrules 450 coupled to threaded apertures in the purge gas distribution plate 452 are used to secure conduits 407 inside apertures 405. O-rings or gaskets 456 made of materials that are compatible with the process environment may be used to provide sealing between various components, e.g., to prevent process gases in the mixing region 102 from entering gas channel 454. The gas channel 454 may be connected to a gas source (not shown) different from the process gas source. The gas flowing into the channel 454 flows thought the portion 405A of the aperture 405 and exits the face plate 108 into the processing region, thereby protecting the ends of the conduits 407 from processing gases. Gases suitable for this purpose may include nitrogen, argon, inert gases, or other gases that are compatible with the particular process. For certain applications, this gas may also form a component of the gas mixture used for processing.

Embodiments of the apparatus of this invention can be used in various methods involving photo-assisted or photo-induced processes. For example, UV radiation may be used for photo-excitation or photo-dissociation of one or more process gases to produce reactive species required for deposition or etching processes. Such a photo-assisted or photo-induced process may allow film deposition to occur at a lower temperature or a higher rate than otherwise possible with a purely thermal process. In other applications, the radiation may be used to treat or condition a substrate, either before or after one or more process gases are introduced into the chamber, or before or after substrate processing. For example, radiation may be used to remove native oxide or contaminants from a substrate prior to depositing a film on the substrate, raise the energy state of a surface prior to deposition, or it may be used to treat, anneal, condition or modify a deposited film or the substrate. Alternatively, radiation may also be used for treating the process chamber or its component parts, either alone or in conjunction with one or more process gases, conditioning or cleaning agents. The step of treating may generally be used to encompass cleaning, annealing, conditioning or otherwise modifying a surface, substrate or component.

Furthermore, various embodiments of the present invention, e.g., different configurations of gas-distribution and radiation-distribution apertures, radiation conduits and sources, zone configurations on the face plate, among others, may be used alone or in various combinations.

Figure 6:
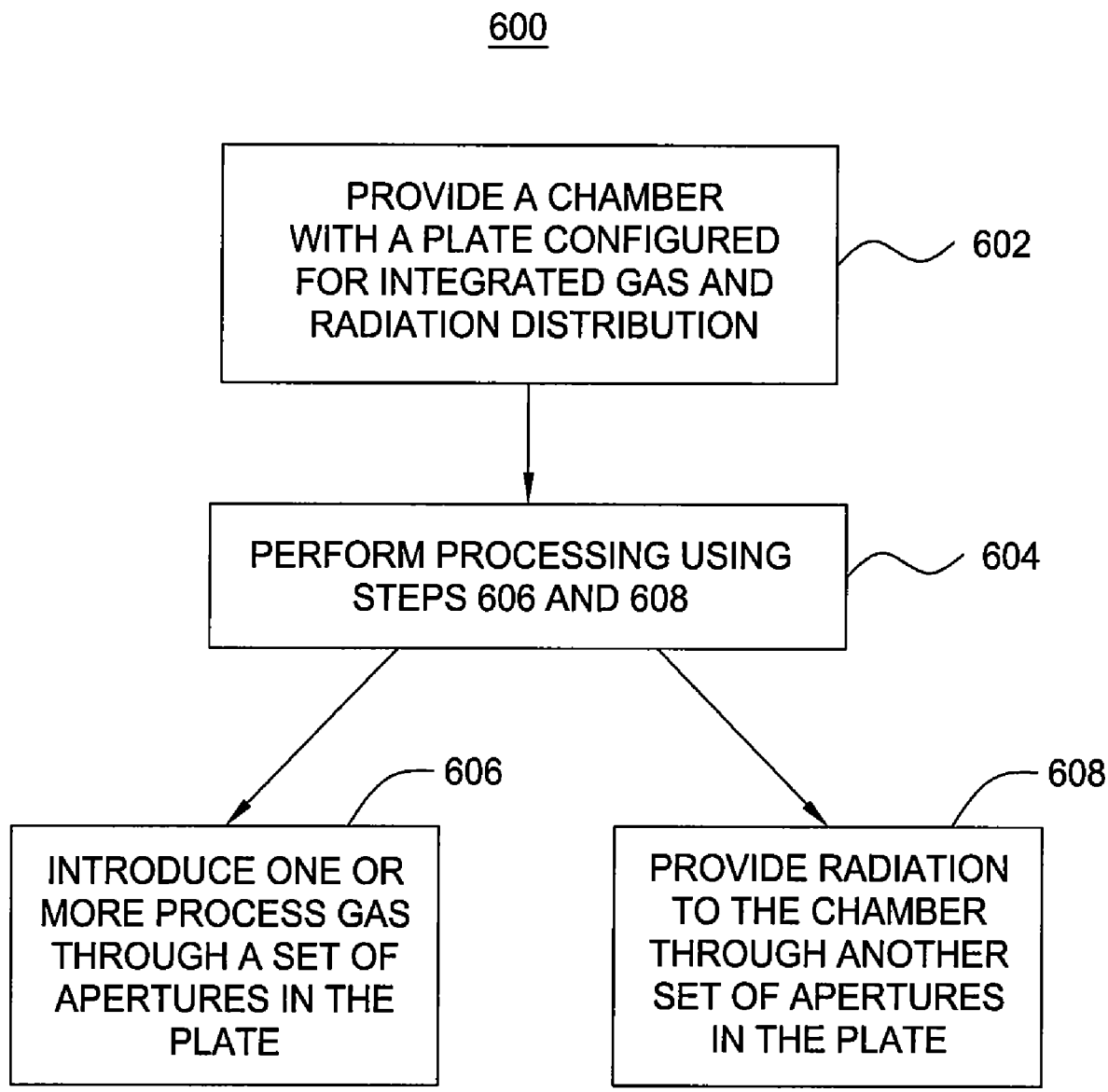
FIG. 6 illustrates a method 600 according to one embodiment of the present invention.

FIG. 6 illustrates a method 600 of processing according to one embodiment of the present invention. The method 600 starts with step 602, which provides a chamber having a plate configured for integrated gas and radiation distribution. In step 604, processing is performed inside the chamber using steps 606 and 608, which may be carried out sequentially or concurrently. Such processing may include, for example, film depositing, etching, cleaning, and treating or conditioning of a substrate, a chamber or its component parts. In step 606, one or more process gas is introduced into the chamber through a set of apertures in the plate. In step 608, radiation is provided to the chamber through another set of apertures in the plate.

While the foregoing is directed to embodiments of the present invention, other and further embodiments of the invention may be devised without departing from the basic scope thereof, and the scope thereof is determined by the claims that follow.

The invention claimed is:

1. An apparatus comprising:
a process chamber having a process region defined therein;
a plate having one or more first apertures for distributing at least one gas into the process region and one or more second apertures for distributing radiation into the process region;
a light transmitting conduit, having an optical fiber or a light pipe, disposed inside the one or more second apertures, wherein the light transmitting conduit is connected to at least one radiation source such that light from the radiation source pass through the optical fiber or the light pipe to the process chamber; and
a support proximate the plate for supporting a substrate for processing inside the chamber.

2. The apparatus of claim 1, wherein the conduit is surrounded by a channel configured for providing a gas flow around a tip of the conduit.

3. The apparatus of claim 1, wherein the plate comprises at least two zones each having different configurations of the one or more first apertures and the one or more second apertures.

4. The apparatus of claim 1, wherein the at least one radiation source comprises a first radiation source and a second radiation source, and the second radiation source having at least one spectral characteristic that is different from the first radiation source.

5. The apparatus of claim 1, wherein the process chamber is one of a deposition chamber and an etching chamber.

6. The apparatus of claim 1, wherein the light transmitting conduit is a flexible conduit.

7. The apparatus of claim 1, wherein the end of the light transmitting conduit is provided with a diffuser to increase a larger illumination.

8. The apparatus of claim 1, wherein the first aperture comprises a channel region connected to an outwardly tapered region near a bottom of the plate.

9. The apparatus of claim 1, wherein the first aperture further comprises an outwardly tapered region at a top surface of the plate.

10. The apparatus of claim 1, wherein the first aperture comprises a channel region connected to a narrower region towards a bottom of the plate.

11. The apparatus of claim 10, wherein the ratio of the lateral dimensions between the narrower region and the channel region is about 1:4.

* * * * *